US006941540B2

(12) United States Patent
Kumagai

(10) Patent No.: US 6,941,540 B2
(45) Date of Patent: Sep. 6, 2005

(54) DESIGN METHOD FOR GATE ARRAY INTEGRATED CIRCUIT

(75) Inventor: Satoru Kumagai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 8 days.

(21) Appl. No.: 10/428,827

(22) Filed: May 5, 2003

(65) Prior Publication Data

US 2003/0212977 A1 Nov. 13, 2003

(30) Foreign Application Priority Data

May 13, 2002 (JP) ....................................... 2002-137659

(51) Int. Cl.[7] ................................................ G06F 17/50
(52) U.S. Cl. ................................ 716/16; 716/8; 716/12
(58) Field of Search ................................ 716/16, 8, 12

(56) References Cited

U.S. PATENT DOCUMENTS

| | | | |
|---|---|---|---|
| 5,864,487 | A | 1/1999 | Merryman et al. |
| 2003/0051221 | A1 | 3/2003 | Mizuno et al. |

FOREIGN PATENT DOCUMENTS

| | | |
|---|---|---|
| JP | 60188397 | 7/1994 |
| JP | 2001-53233 A | 2/2001 |
| JP | 2001-259136 | 8/2001 |

OTHER PUBLICATIONS

R. Andrew et al., Multiphase Synchronous Circuits for Low Power Performance, *Microelectronics Journal* 1998,29:105–111, Elsevier Science Limited, Great Britain.

M. Swinnen et al., "Timing Issues Related to the Automated Placement of High Performance ASICs," Proceedings 4$^{th}$ Annual IEEE International, 1991, XP010048530, pp. P14–6–1 through P14–6–4.

Y. Tamiya et al., "LP Based Cell Selection with Constraints of Timing, Area, and Power Consumption," IEEE/ACM International Conference on Computer–Aided Design, Digest of Technical Papers, 1994, XP010252166 pp. 378–381.

K. Zhu et al., "Clock Skew Minimization During FPGA Placement, " Proceedings of the 31$^{st}$ Annual Conference on Design Automation Conference, XP002252884, pp. 232–237.

S. Zimmermann et al., "A Formal Approach to Pipeline Optimization in Synthesis of Digital Signal Processors with Fine Grain Parallelism," Circuits and System—1994 IEEE International Symposium, XP010143013, pp. 325–328.

Patent Abstracts of Japan, vol. 018, No. 531, 1994, Abstract.

*Primary Examiner*—Vuthe Siek
*Assistant Examiner*—Brandon Bowers
(74) *Attorney, Agent, or Firm*—Foley & Lardner LLP

(57) ABSTRACT

A gate array design method is disclosed for an integrated circuit whose core region is divided into a plurality of areas, each of which includes sequential circuit sites. The method is composed of providing a netlist and a site array data, allocating each of multi-phase clock signals used in the integrated circuit to each of the plurality of areas to produce an allocation data representative of an association of the multi-phase clock signals to the plurality of areas, modifying the site array data based on said allocation data, modifying the netlist to allow the netlist to correspond to the modified site array data, and placing and routing the integrated circuit based on the modified netlist and site array data. The site array data is modified to allow each of the plurality of areas to include sequential circuit cells which are provided with a same one of the multi-phase clock signals.

10 Claims, 14 Drawing Sheets

Fig. 6

| CONTROL SIGNALS PROVIDED FOR MULTIPLEXERS | | | | | | | | | | | | | | | | | | | | | | | | CLOCK SIGNAL DISTRIBUTED TO EACH AREA | | | |
|---|---|---|---|---|---|---|---|---|---|---|---|---|---|---|---|---|---|---|---|---|---|---|---|---|---|---|---|
| MC101 | | | MC102 | | | MC103 | | | MC104 | | | MC 201 | | MC 202 | | MC 203 | | MC 204 | | MC 301 | MC 302 | MC 303 | MC 304 | Area1 | Area2 | Area3 | Area4 |
| S0 | S1 | S2 | S0 | S1 | S2 | S0 | S1 | S2 | S0 | S1 | S2 | S0 | S1 | S0 | S1 | S0 | S1 | S0 | S1 | S0 | S0 | S0 | S0 | | | | |
| 0 | 0 | 0 | 0 | 0 | 1 | 0 | 1 | 0 | 0 | 1 | 1 | 0 | 0 | 0 | 1 | 1 | 0 | 1 | 1 | 0 | 0 | 0 | 0 | a (CLK_A) | a (CLK_A) | c (CLK_C) | c (CLK_C) |
| | | | | | | | | | | | | | | | | | | | | 0 | 1 | 0 | 1 | a (CLK_A) | b (CLK_B) | c (CLK_C) | d (CLK_D) |
| | | | | | | | | | | | | | | | | | | | | 1 | 0 | 1 | 0 | b (CLK_B) | a (CLK_A) | d (CLK_D) | c (CLK_C) |
| | | | | | | | | | | | | | | | | | | | | 1 | 1 | 1 | 1 | b (CLK_B) | b (CLK_B) | d (CLK_D) | d (CLK_D) |

FF CLK_A FF1
FF CLK_B FF2
FF CLK_C FF3
⋮

DESIGN METHOD FOR GATE ARRAY INTEGRATED CIRCUIT

BACKGROUND OF THE INVENTION

1. Field of the Invention

The present invention is related to a design method of an integrated circuit, in particular, to a gate array technology for designing a gate array integrated circuit including a clock tree which distributes multi-phase clock signals.

2. Description of the Related Art

A gate array technology (or a masterslice technology), which is one of the semi-custom design methods, is often used to reduce a TAT (turn around time) of integrated circuit design. The gate array technology involves providing a base array slice embedded with base cells, placing cells of a desired integrated circuit (that is, allocating the cells described in the desired integrated circuit to the base cells), and routing interconnections between the cells.

One of the significant issues of a gate array technology is clock skew management. Japanese Open Laid Patent Application No. Jp-A-Heisei 6-188397 discloses a gate array technology for reducing a clock skew caused by a difference in clock line lengths. In the disclosed gate array technology, a core region is divided into a sequential circuit cell region and remaining primitive cell regions. All the sequential circuit cells, which include therein sequential circuits such as flipflops, are arranged in the sequential circuit cell region. This architecture effectively reduces clock line lengths, and thus improves the clock skew.

Recent gate array integrated circuits often requires multi-phase clock signals, whose phases are different from each other. However, the aforementioned gate array technology is not suited for designing an integrated circuit in which multi-phase clock signals are used.

The applicant of the present application discloses an improved clock tree structure in Japanese Patent Application No. 2001-259136. The disclosed clock tree structure facilitates the distribution of multi-phase clock signals. In addition, the disclosed clock tree achieves uniform loads and lengths of the clock lines, and thereby effectively reduces the clock skew.

Design of a clock tree distributing multi-phase clock signals, however, often requires considerable man-hours. Each multi-phase clock signal may be inputted to thousands of sequential circuits, and thus an increased number of the multi-phase clock signals considerably complicates the clock tree in structure. This undesirably increases a TAT of integrated circuit design.

A need exists to provide a method for helping design an integrated circuit including a clock tree which distributes multi-phase clock signals.

SUMMARY OF THE INVENTION

Therefore, an object of the present invention is to provide a method for helping design an integrated circuit including a clock tree which distributes multi-phase clock signals.

In an aspect of the present invention, a gate array design method for an integrated circuit whose core region is divided into a plurality of areas, each of which includes sequential circuit sites, is composed of:

providing a netlist describing cells and interconnections thereof within the integrated circuit, the cells including sequential circuit cells to be placed in the sequential circuit sites;

providing a site array data which describes site names of the sites, the sites name respectively indicating cell types of cells which are allowed to be placed within the sites associated therewith;

allocating each of multi-phase clock signals used in the integrated circuit to each of the plurality of areas to produce an allocation data representative of an association of the multi-phase clock signals to the plurality of areas;

modifying the site array data based on the allocation data to allow each of the plurality of areas to include sequential circuit cells which are provided with a same one of the multi-phase clock signals;

modifying the netlist to allow the netlist to correspond to the modified site array data; and placing and routing the integrated circuit based on the modified netlist and the site array data.

When the plurality of areas include a first area associated with one of the multi-phase clock signals, and a second area associated with another of the multi-phase clock signals, and the sequential circuit sites includes first sequential circuit sites located in the first area, and second sequential circuit sites located in the second area, then the site names described in the site array data are preferably modified such that site names of the first sequential circuit sites are different from site names of the second first sequential circuit sites.

In this case, the netlist is modified such that cell types of sequential circuit cells located within the first sequential circuit sites correspond to the site names of the first sequential circuit sites, and that cell types of sequential circuit cells located within the second sequential circuit sites correspond to the site names of the second sequential circuit sites to be different from the cell types of sequential circuit cells located within the first sequential circuit sites.

The allocating may includes providing a graphical user interface which allows a user to allocate each of multi-phase clock signals used in the integrated circuit to each of the plurality of areas.

Alternatively, the allocating may includes obtaining the allocation data from a previously provided allocation data file.

In another aspect of the present invention, a computer-readable medium is provided on which is stored a computer program for designing an integrated circuit whose core region is divided into a plurality of areas, each of which includes sequential circuit sites, the computer program comprising instructions which, when executed by a computer, perform the steps of:

providing a netlist describing cells and interconnections thereof within the integrated circuit, the cells including sequential circuit cells;

providing a site array data which describes site names of the sites, the sites name respectively indicating cell types of cells which are allowed to be placed within the sites associated therewith;

allocating each of multi-phase clock signals used in the integrated circuit to each of the plurality of areas to produce an allocation data representative of an association of the multi-phase clock signals to the plurality of areas;

first modifying the site array data to allow each of the plurality of areas to include sequential circuit cells which are provided with a same one of the multi-phase clock signals;

second modifying the netlist based on the modified site array data; and placing and routing the integrated circuit based on the modified netlist.

BRIEF DESCRIPTION OF THE DRAWINGS

FIG. 6 shows a truth table illustrating the association of the values of control signals to which multi-phase clock signal is distributed to each of the areas;

FIG. 17 shows contents of the modification table 54; and

FIG. 18 shows contents of a modified site array data 50*a*.

DESCRIPTION OF THE PREFERRED EMBODIMENTS

The present invention will be described below in detail with reference to the attached drawings.

Integrated Circuit to be Designed

Figure 1:
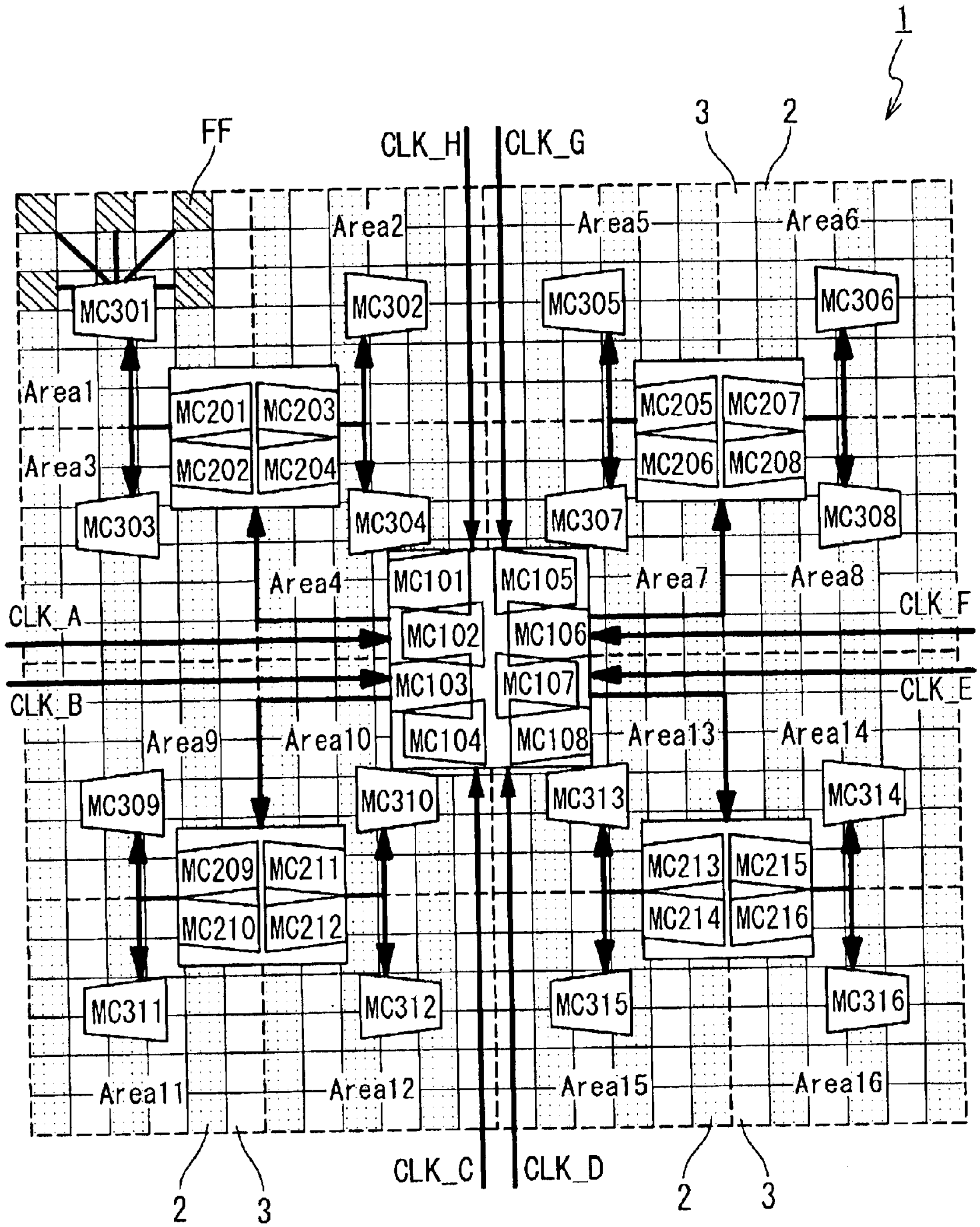
FIG. 1 is a schematic illustrating the structure of an integrated circuit to be designed.
Figure 2:
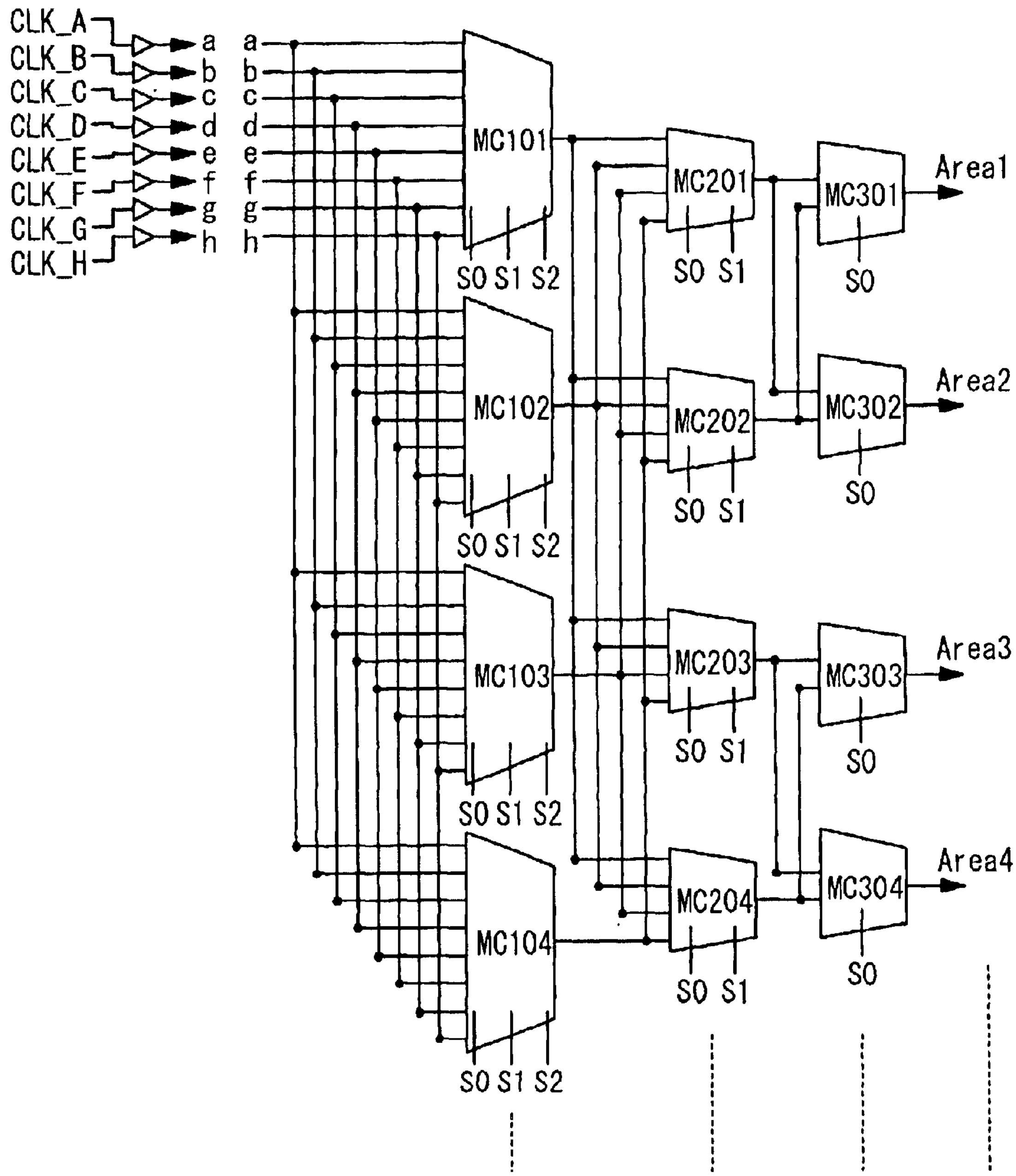
FIGS. 2 to 5 schematically show a clock tree structure embedded within the integrated circuit.
Figure 3:
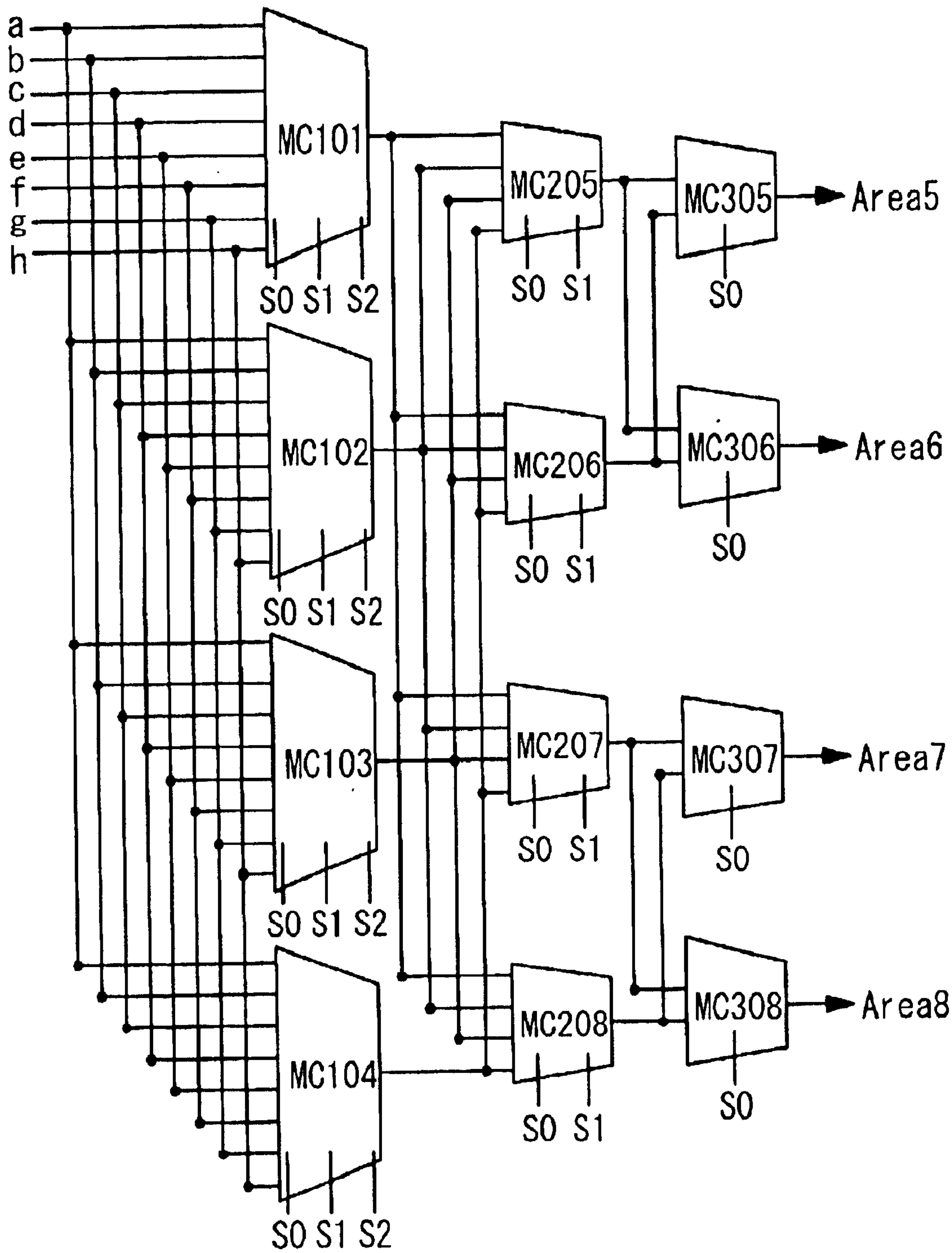
Figure 4:
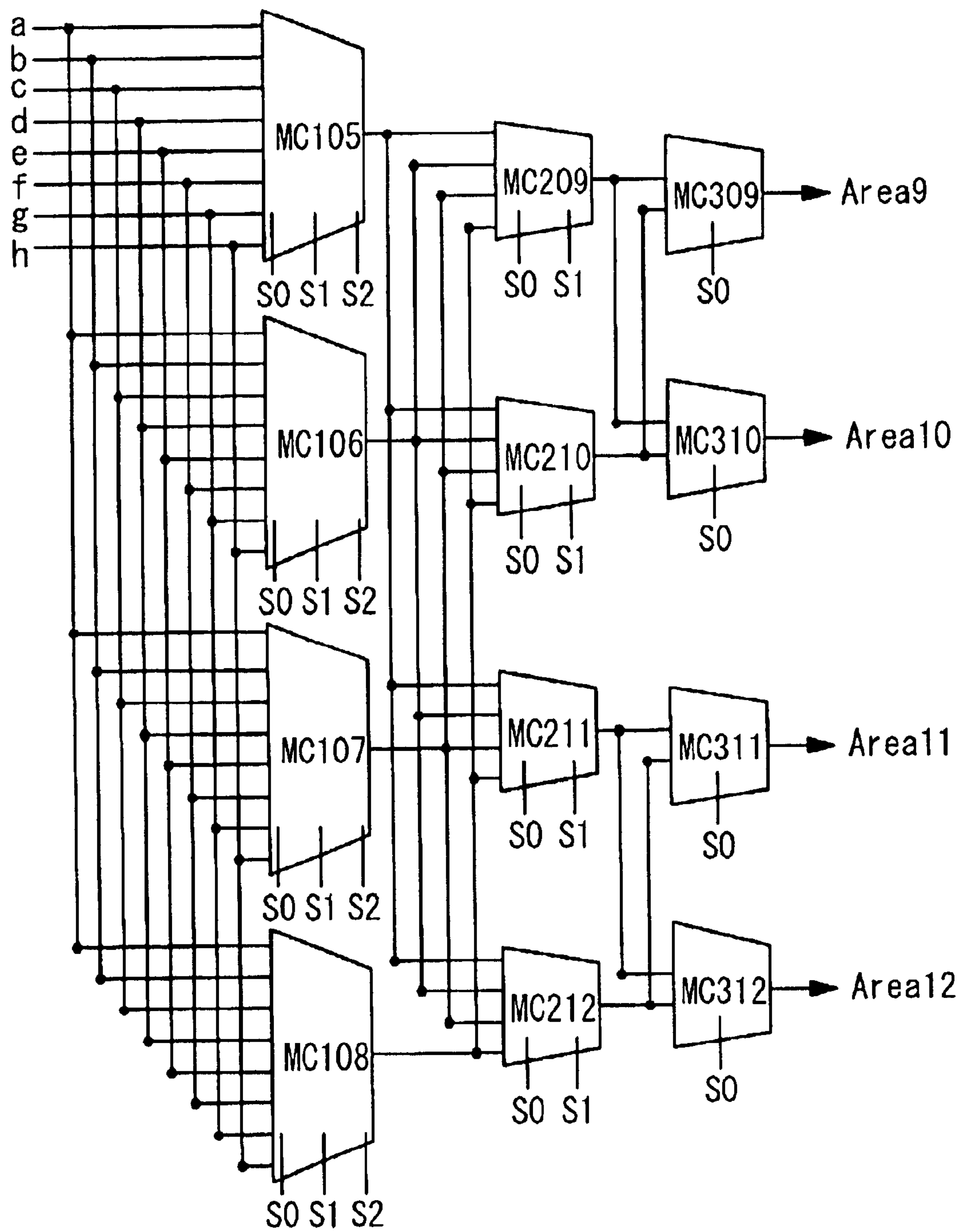
Figure 5:
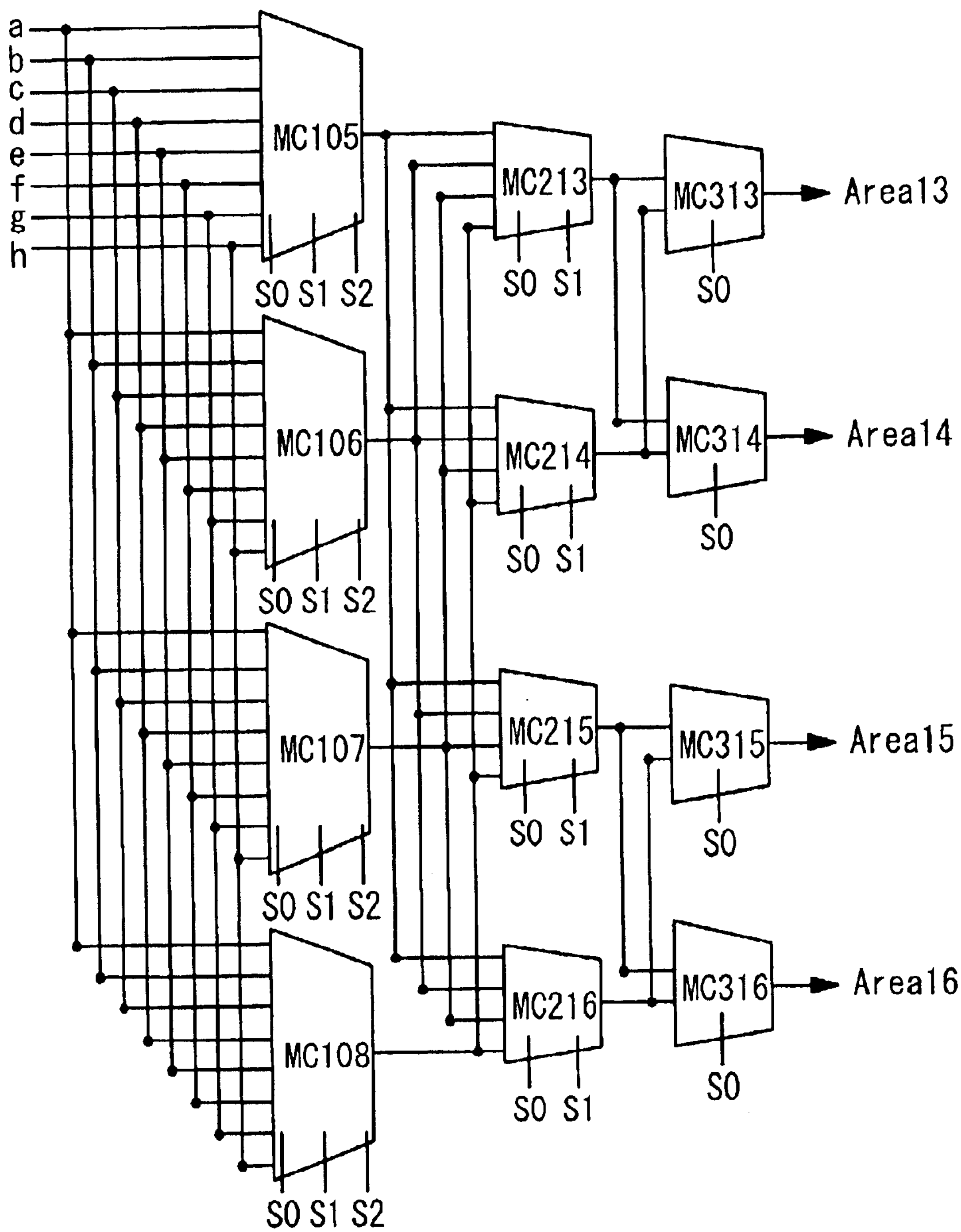

FIG. 1 shows a structure of a gate array integrated circuit to be designed in one embodiment according to the present invention. The gate array integrated circuit 1 includes the aforementioned improved clock tree structure disclosed in the Japanese Patent Application No. 2002-137659.

The gate array integrated circuit 1 includes a core region which is divided into areas Area1 to Area16. Each area are divided into a plurality of "sites". The sites include sequential circuit sites 2 and combination circuit sites 3. Sequential circuit cells, such as flipflop cells, are placed in the sequential circuit sites 2, while combination circuit cells are placed in the combination circuit sites 3.

The sequential circuit sites 2 and the combination circuit sites 3 are respectively arranged in columns, and the columns of the sequential circuit sites 2 and the columns of the combination circuit sites 3 are arranged in the alternate fashion.

The arrangement of The sequential circuit sites 2 and the combination circuit sites 3 is not limited to that shown in FIG. 1. In alternative embodiment, the sequential circuit sites 2 and the combination circuit sites 3 may be respectively arranged in rows, the rows of the sequential circuit sites 2 and the combination circuit sites 3 being arranged in the alternate fashion. In another alternative embodiment, the sequential circuit sites 2 and the combination circuit sites 3 are arranged in a checkered pattern.

The integrated circuit 1 includes a clock tree structure which distributes multi-phase clock signals CLK_A to CLK_H, which have different phases, to the respective areas Area1 to Area16. Each area is selectively provided with one of the multi-phase clock signals CLK_A to CLK_H, and all the sequential circuit cells located in each area operate in synchronization with the provided multi-phase clock signal. A layout of the clock tree structure is previously prepared in a library, and universally used for various integrated circuits.

The clock tree structure includes eight-input multiplexers MC101 to MC108, four-input multiplexers MC201 to MC216, and two-input multiplexers MC301 to MC316. The multiplexers are designed to have high output drive to reduce the delay time of the clock tree structure.

The multiplexers are arranged so that the clock tree structure has uniform loads and clock line lengths. In one embodiment, the multiplexers MC101 to MC108 are disposed at the center of the core area. The multiplexers MC201 to MC204 are disposed at the center of an area consisting of the areas Area1 to Area4. The multiplexers MC205 to MC208 are disposed at the center of an area consisting of the areas Area5 to Area8. The multiplexers MC209 to MC212 are disposed at the center of an area consisting of the areas Area9 to Area12. The multiplexers MC213 to MC216 are disposed at the center of an area consisting of the areas Area13 to Area16. The multiplexers MC301 to MC316 are respectively disposed at the center of the areas Area1 to Area16.

FIGS. 2 to 5 show circuit diagrams of the clock tree structure. Each of the multiplexers MC101 to MC108 receives the multi-phase clock signals CLK_A to CLK_H from an external world. The outputs of the multiplexers MC101 to MC104 are distributed to each of the multiplexers MC201 to MC208, while the outputs of the multiplexers MC105 to MC108 are distributed to each of the multiplexers MC209 to MC216.

The outputs of the multiplexers MC201 and MC202 are distributed to each of the multiplexers MC301 and MC302, and the outputs of the multiplexers MC203 and MC204 are distributed to each of the multiplexers MC303 and MC304. Similarly, the outputs of the multiplexers MC205 and MC206 are distributed to each of the multiplexers MC305 and MC306, and the outputs of the multiplexers MC207 and MC208 are distributed to each of the multiplexers MC307 and MC308. Furthermore, the outputs of the multiplexers MC209 and MC210 are distributed to each of the multiplexers MC309 and MC310, and the outputs of the multiplexers MC211 and MC212 are distributed to each of the multiplexers MC311 and MC312. Finally, the outputs of the multiplexers MC213 and MC214 are distributed to each of the multiplexers MC313 and MC314, and the outputs of the multiplexers MC215 and MC216 are distributed to each of the multiplexers MC315 and MC316.

The output of the multiplexer MC301 is distributed to the sequential circuit cells placed in the area Area1. For example, The output of the multiplexer MC301 is distributed to flipflops FF as shown in FIG. 1. The same goes for the multiplexer MC302 to MC316. The outputs of the multiplexer MC302 to 316 are distributed to the sequential circuit cells placed in the area Area2 to Area16, respectively.

The interconnections of the clock tree structure are routed so as to have the same clock line length. The interconnections providing the multiplexers MC101 to MC108 with the multi-phase clock signals CLK_A to CLK_H from an external world are routed so as to have the same interconnection length. The interconnections connecting the outputs of the multiplexers MC101 to MC108 to the inputs of the multiplexers MC201 to MC216 are routed so as to have the same interconnection length. The interconnections connecting the outputs of the multiplexers MC201 to MC216 to the inputs of the multiplexers MC301 to MC316 are routed so as to have the same interconnection length. Furthermore, the interconnections providing the sequential circuit cells with the outputs of the multiplexers MC301 to MC316 are routed so as to have the same interconnection length.

Each multiplexer receives one or more control signals. Each of the eight-input multiplexers MC101 to MC108 are provided with a set of control signals S0, S1, and S2, each of the four-input multiplexers MC201 to MC216 are provided with a set of control signals S0, and S1, and each of the two-input multiplexers MC301 to MC316 are provided with a control signal S0.

The value of each control signal is determined on the basis of the function of the integrated circuit to be designed. The value of each control signal is determined so as to allow the clock tree structure to distribute desired one of the multi-phase clock signals CLK_A to CLK_H to each area. An interconnection transmitting a control signal is connected to a power supply line when the control signal is to be set at logical "1", while the interconnection is connected to an earth line when the control signal is to be set at logical "0". It should be noted that the control signal(s) inputted to different multiplexers may have different signal levels, although denoted by the same numeral S0, S1, and/or S2.

FIG. 6 shows a table illustrating the association of the values of the control signals S0, S1, and S2 to which multi-phase clock signal is distributed to each of the areas Area1 to Area4. The eight input multiplexers MC101 to MC108 selectively output the clock CLK_A when all the control signals S0, S1, and S2 are set at logical "0". Similarly, the multiplexers MC101 to MC108 selectively output the clock CLK_B when the control signals S0, S1, and S2 are respectively set at logical "0", "0", and "1", the clock CLK_C for logical "0", "1", and "0", the clock CLK_D for logical "0", "1", and "1", the clock CLK_E for logical "1", "0", and "0", the clock CLK_F for logical "1", "0", and "1", the clock CLK_G for logical "1", "1", and "0", and the clock CLK_H for logical "1", "1", and "1".

The four-input multiplexers MC201 to MC216 selects a first input thereof (e.g. the output of the multiplexer MC101 for the multiplexer MC201), when both of the controls signals S0, and S1 are set at logical "0". Similarly, the multiplexers MC201 to MC216 select a second input thereof (e.g. the output of the multiplexer MC102 for the multiplexer MC201) when the controls signals S0, and S1 are respectively set at logical "0" and "1", a third input (e.g. the output of the multiplexer MC103 for the multiplexer MC201) for logical "1" and "0", and a fourth input (e.g. the output of the multiplexer MC104 for the multiplexer MC201) for logical "1" and "1".

The two-input multiplexers MC301 to MC316 selects a first input thereof (e.g. the output of the multiplexer MC201 for the multiplexer MC301) when the control signal S0 is set at logical "0", while selecting a second input (e.g. the output of the multiplexer MC202 for the multiplexer MC301) when the control signal S0 is set at logical "1".

Therefore, setting the controls signals provided for the multiplexers at the states shown in FIG. 6 allows the clock tree structure to distribute a desired multi-phase clock signal to each area. For example, the multi-phase clock signals CLK_A or CLK_B may be selectively distributed to the areas Area1 and Area2, and the multi-phase clock signals CLK_C or CLK_D may be selectively distributed to the areas Area3 and Area4.

The same goes for the multiplexers MC105 to MC108, MC205 to MC216, and MC305 to MC316. An appropriate provision of the control signals for the multiplexers MC105 to MC108, MC205 to MC216, and MC305 to MC316 allows the clock tree structure to distribute desired one of the multi-phase clock signals to each of the areas Area5 to Area16.

Although the sequential circuit cells are placed to entirely cover the sequential circuit sites 2, not all the sequential circuit cells are used to realize the desired logic of the integrated circuit 1.

One or more of the unused sequential circuit cells may be connected to the outputs of the multiplexer MC301 to MC316 to equalize the loads connected to the outputs of the multiplexer MC301 to MC316.

Figure 7:
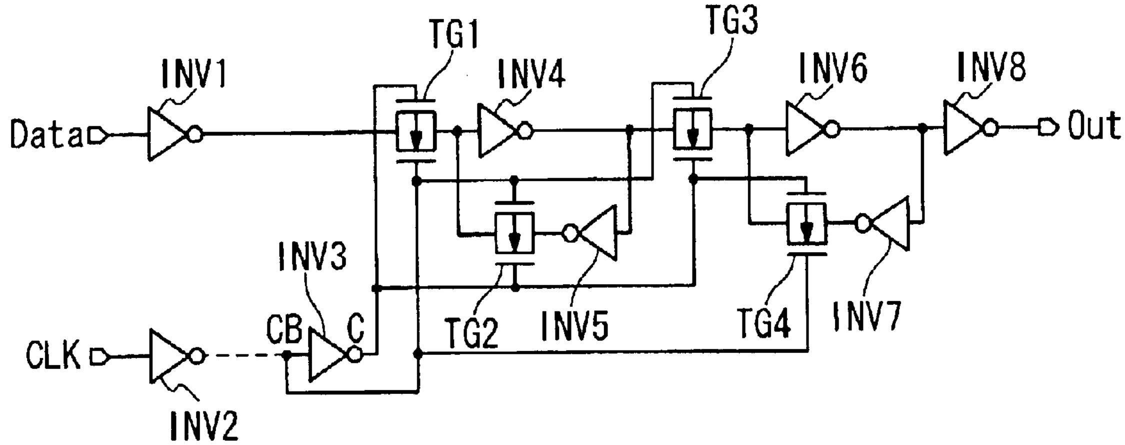
FIG. 7 shows a circuit schematic of a D-flipflop in one embodiment.

The load-equalizing sequential circuit cells, however, may undesirably increase power consumption. In one embodiment, in order to reduce the power consumption, each D-flipflop embedded within the sequential circuit cells is preferably designed as shown in FIG. 7. The D-flipflop includes inverters INV1 to INV8 and the transfer gates TG1 to TG4.

Figure 8A:
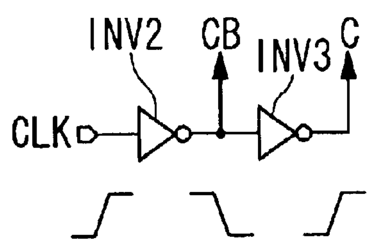
FIGS. 8A and 8B show signal levels of inputs and outputs of inverters within the D-flipflop.

When a sequential circuit cell including the D-flipflop shown in FIG. 7 is used to form the desired logic of the integrated circuit 1, the routing of the D-flipflop within the sequential circuit cell is determined so that the output of the inverter INV2, which receives one clock signal CLKC selected from among the multi-phase clock signals CLK_A to CLK_H, is connected to the input CB of the inverter INV3. This allows the signal level of the input and output of the inverter INV3 to be responsive to the received clock signal as shown in FIG. 8A.

Figure 8B:
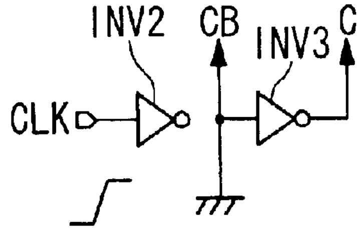
Figure 9:
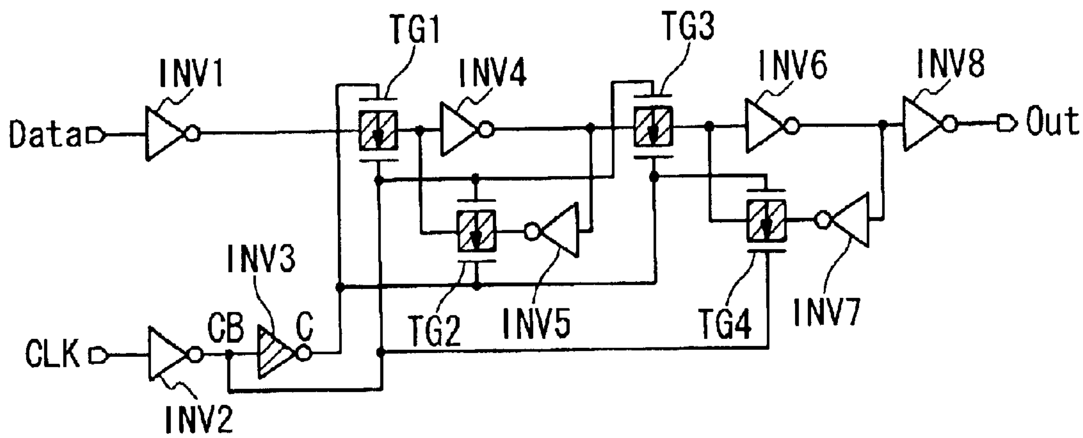
FIG. 9 shows inactivated elements of the D-flipflop when the sequential circuit cell including the D-flipflop is unused.

When the sequential circuit cell is used as the load-equalizing sequential circuit cell, on the other hand, the input CB of the inverter INV3 is disconnected from the output of the inverter INV2, and connected to a power supply line or a earth line. As shown in FIG. 8B, this architecture fixes the input and output of the inverter INV3 to halt the switching of the inverter INV3 and the transfer gates TG1 to TG4, which are hatched in FIG. 9. Therefore, the power consumption of the integrated circuit 1 is effectively reduced.

Figure 10:
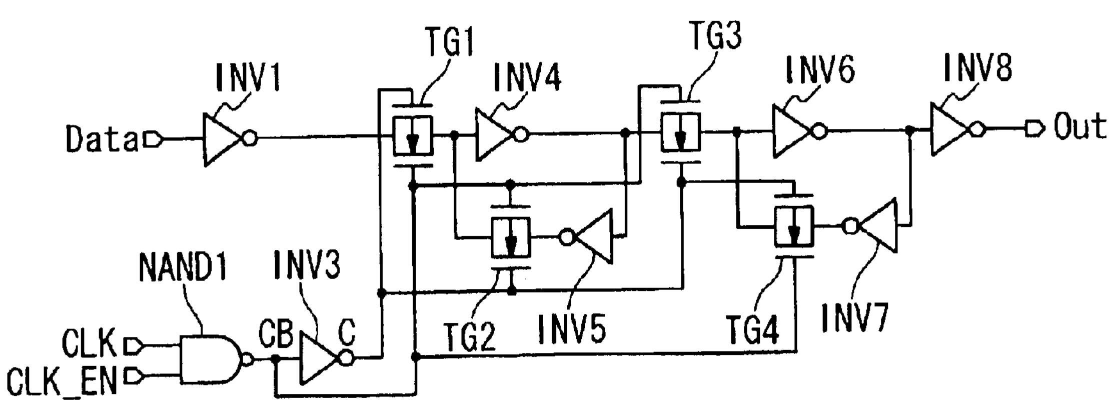
FIG. 10 shows a circuit schematic of another D-flipflop in an alternative embodiment.

In an alternative embodiment, as shown in FIG. 10, the inverter INV2 may be replaced with a NAND gate NAND1 receiving the clock signal CLK on a first input and the enable signal CLK_EN on a second input. The output of the NAND gate NAND1 is connected to the input of the inverter INV3, whether the sequential circuit cell including the D-flipflop is used to form the desired logic of the integrated circuit 1 or used as the load-equalizing sequential circuit cell. The D-flipflop is enabled when the enable signal CLK_EN is activated (or set at logical "1").

Figure 11A:
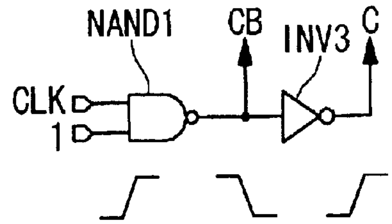
FIGS. 11A and 11B show signal levels of inputs and outputs of inverters within the D-flipflop.

When a sequential circuit cell including the D-flipflop shown in FIG. 10 is used to form the desired logic of the integrated circuit 1, the routing of the D-flipflop within the sequential circuit cell is determined so that the enable signal CLK_EN is set at logical "1", that is, the second input of the inverter INV2 is connected to the power supply line. This allows the signal level of the input and output of the inverter INV3 to be responsive to the received clock signal CLK as shown in FIG. 11A.

Figure 11B:
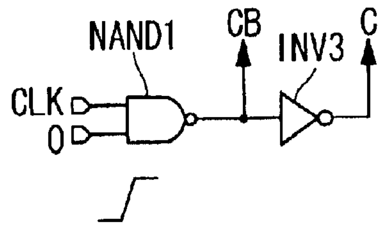
Figure 12:
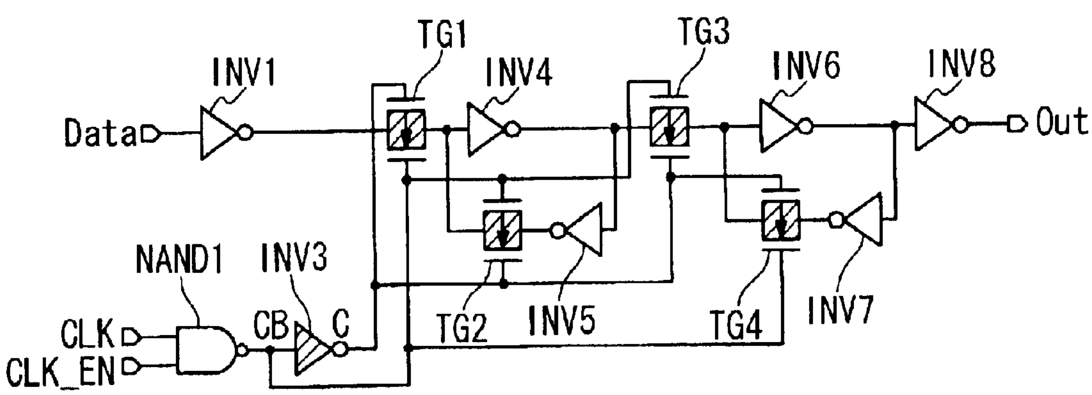
FIG. 12 shows inactivated elements of the D-flipflop when the sequential circuit cell including the D-flipflop is unused.

When the sequential circuit cell including the D-flipflop shown in FIG. 10 is used as the load-equalizing sequential circuit cell, the routing of the D-flipflop within the sequential circuit cell is determined so that the enable signal CLK_EN is set at logical "0", that is, the second input of the inverter INV2 is connected to the earth line. As shown in FIG. 11B, this architecture fixes the input and output of the inverter INV3 to halt the switching of the inverter INV3 and the transfer gates TG1 to TG4, which are hatched in FIG. 12. Therefore, the power consumption of the integrated circuit 1 is effectively reduced.

The NAND gate NAND1 may be replaced with a NOR gate. In this case, the routing of the D-flipflop is determined so that the enable signal CLK_EN is set at logical "0", when the sequential circuit cell including the D-flipflop is used to form the desired logic of the integrated circuit 1. On the contrary, the routing of the D-flipflop is determined so that the enable signal CLK_EN is set at logical "1", when the sequential circuit cell including the D-flipflop is used as the load-equalizing sequential circuit cell. An inverter is preferably inserted into the input or output of the NOR gate to synchronize the D-flipflop including the NOR gate with the D-flipflop shown in FIG. 7.

Design Flow

In one embodiment, a design method in accordance with the present invention is used to design the integrated circuit 1.

Figure 13:
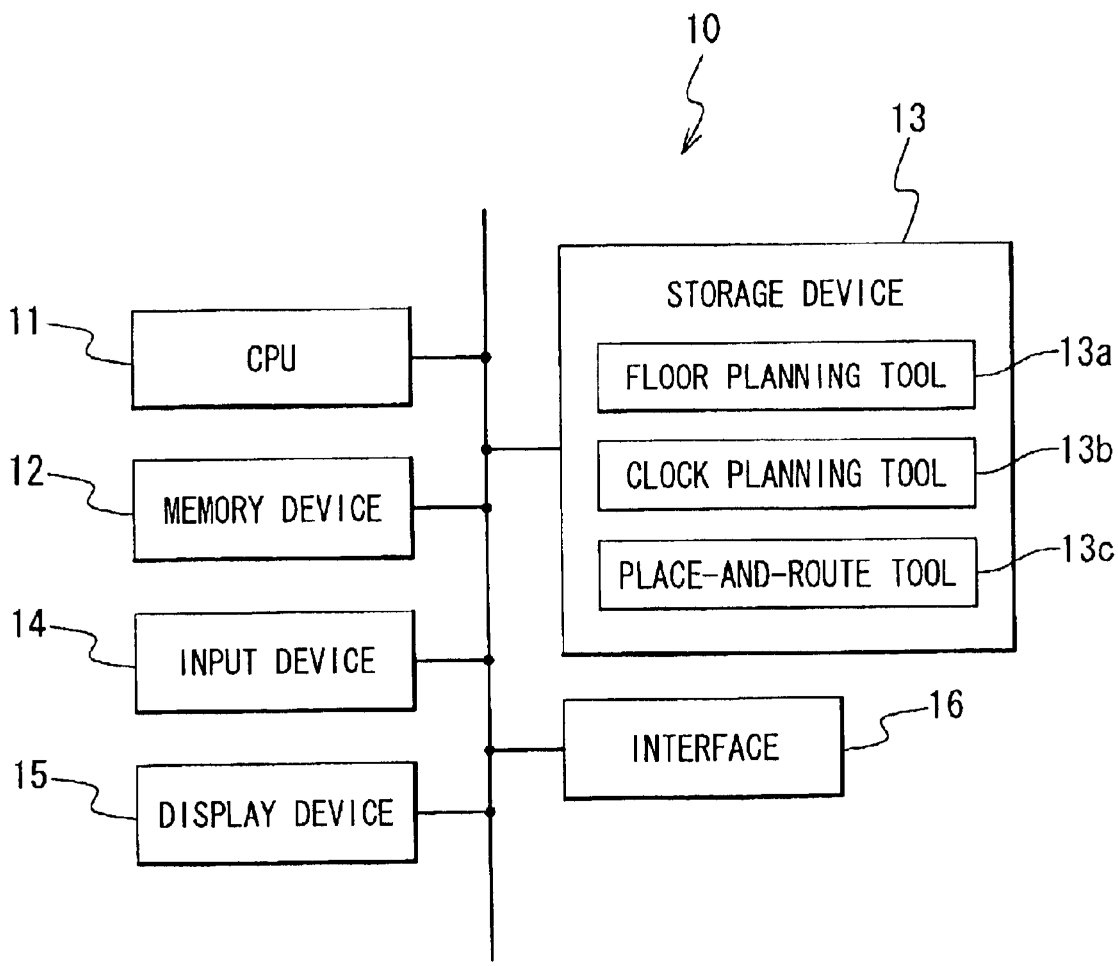
FIG. 13 shows a computer system for implementing the design method in accordance with the present invention.

FIG. 13 shows a computer system 10 for implementing the design method. The computer system 10 includes a CPU 11, a memory device 12, a storage device 13 such as a hard disk drive, an input device 14 such as a keyboard and a pointing device, a display device 15, and an interface 16. The memory device 12 is used to store temporary data produced during the implementation of the design method. The storage device 13 stores therein a floor planning tool 13*a,* a clock planning tool 13*b,* a place-and-route tool 13*c*. The floor planning tool 13*a,* the clock planning tool 13*b,* and the place-and-route tool 13*c* are computer programs to provide instructions for the CPU 11.

Figure 14:
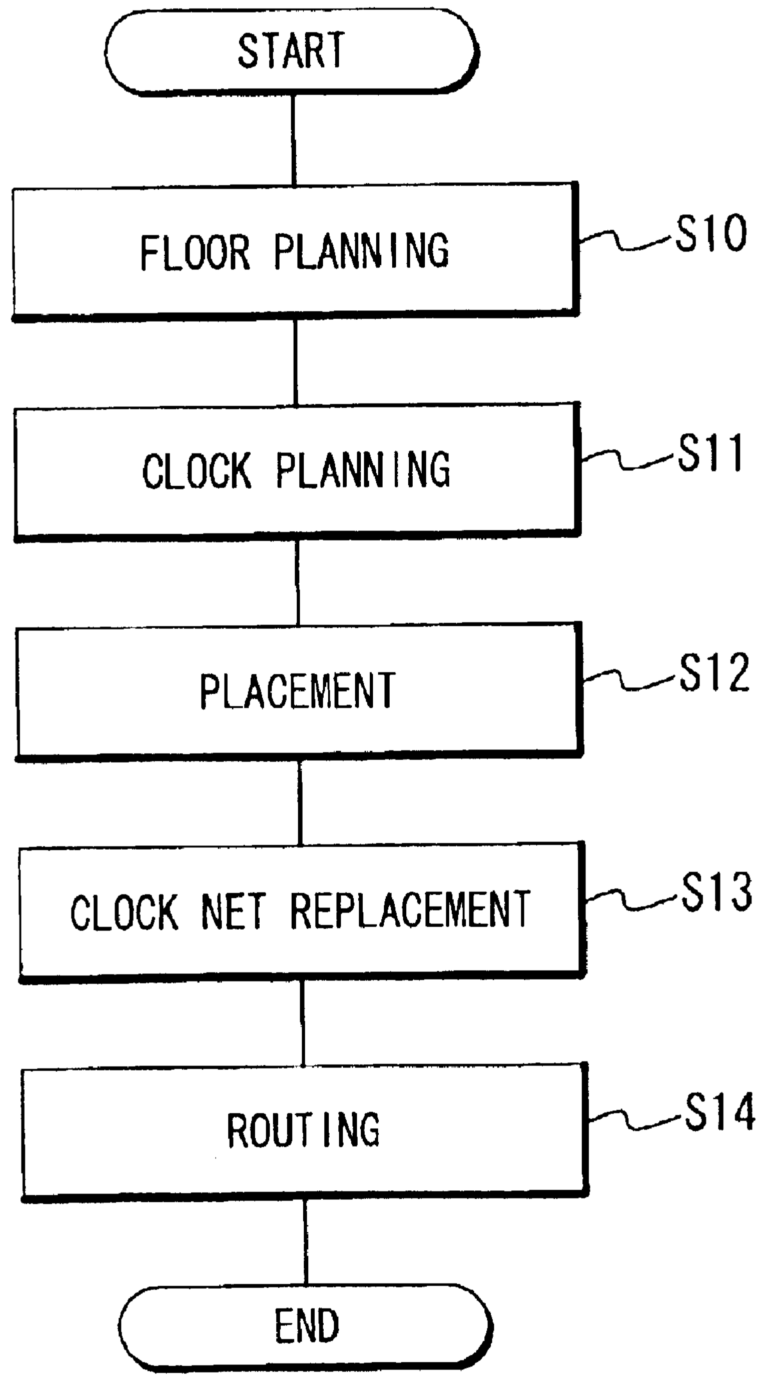
FIG. 14 is a flowchart showing the design method.
Figure 15:
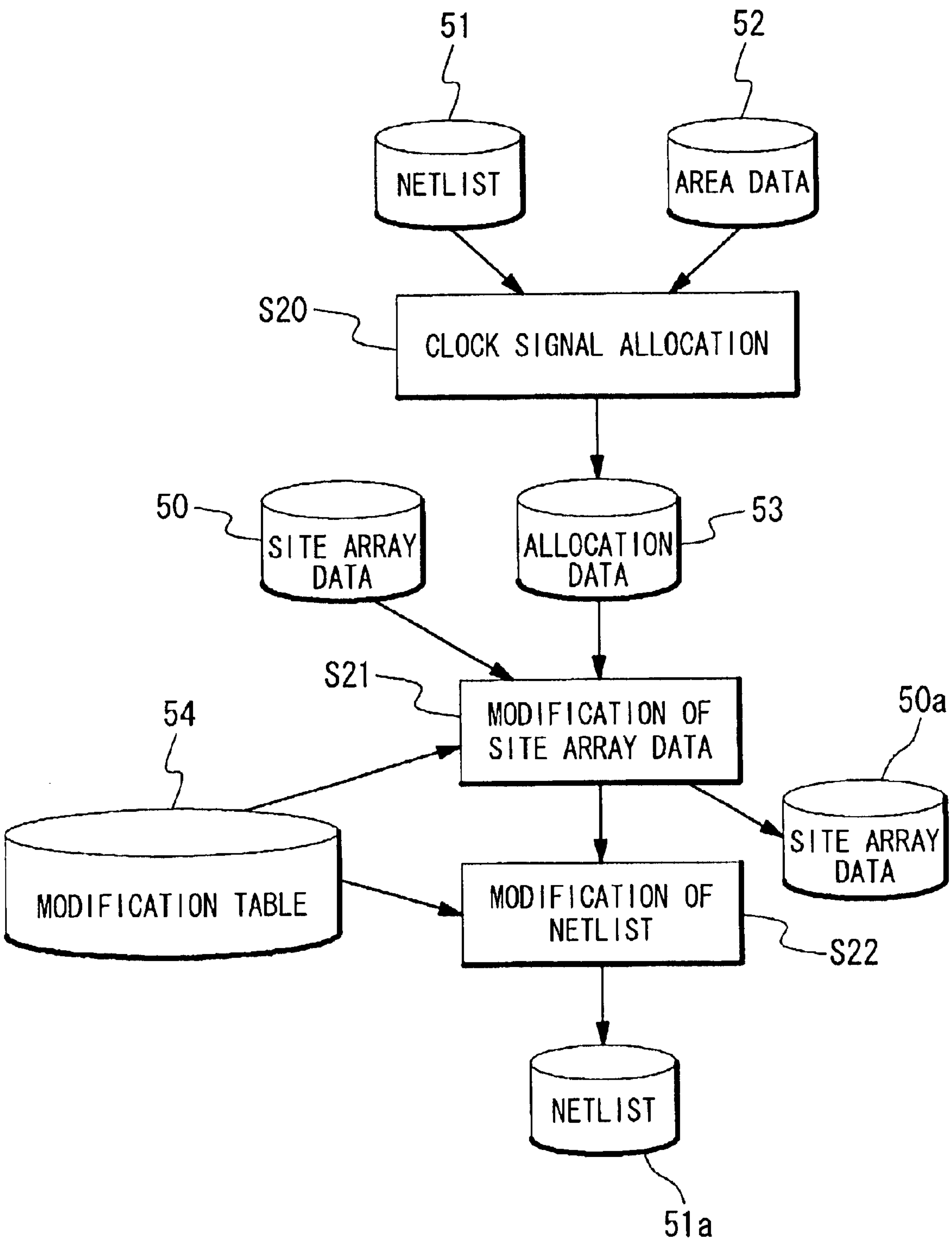
FIG. 15 shows a flow of clock planning.

FIG. 14 is a flow chart illustrating the computer-implemented design method. The design method includes floor planning (Step 10), clock planning (Step 11), placement (Step 12), clock net replacement (Step 13), and routing (Step 14). FIG. 15 shows a flow of clock planning at Step 11.

With reference to FIG. 15, a site array data 50, a netlist 51, an area data 52, and a site name and cell type modification table 54 are previously provided for the computer system 10 through the interface 16. The site array data 50 is stored in a site array data file prepared in the storage device 13. The netlist 51 is stored in a netlist file prepared in the storage device 13. And the area data 52 is stored in an area data file prepared in the storage device 13.

Figure 16A:
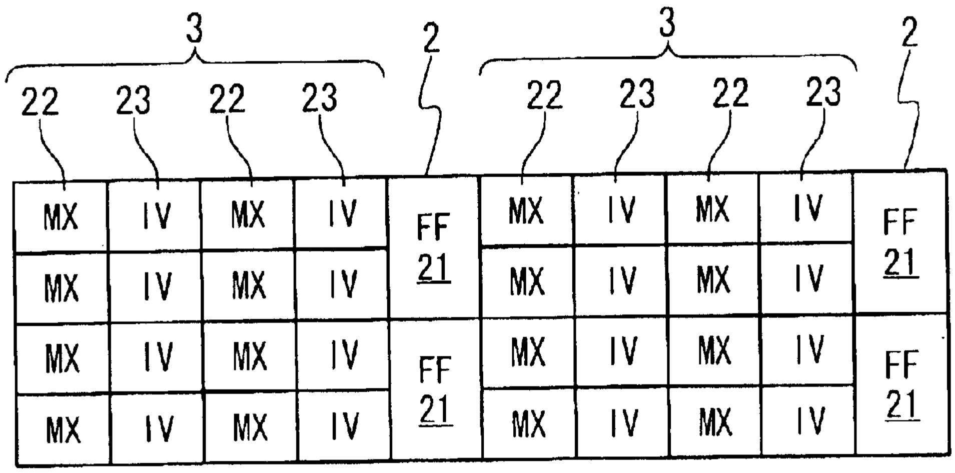
FIG. 16A shows a site arrangement of the integrated circuit to be designed.

The site array data 50 describes the site arrangement of the integrated circuit 1. FIG. 16A shows the detailed arrangement of the sites represented by the site array data 50. The sequential circuit sites 2 typically includes "FF" sites 21 where flipflop cells are to be placed, and the combination circuit sites 3 typically includes "MX" sites 22 where multiplexer cells are to be placed, and "IV" sites 23 where inverter cell are to be placed. The site arrangement is the same in all the areas Area1 to Area16.

Figure 16B:
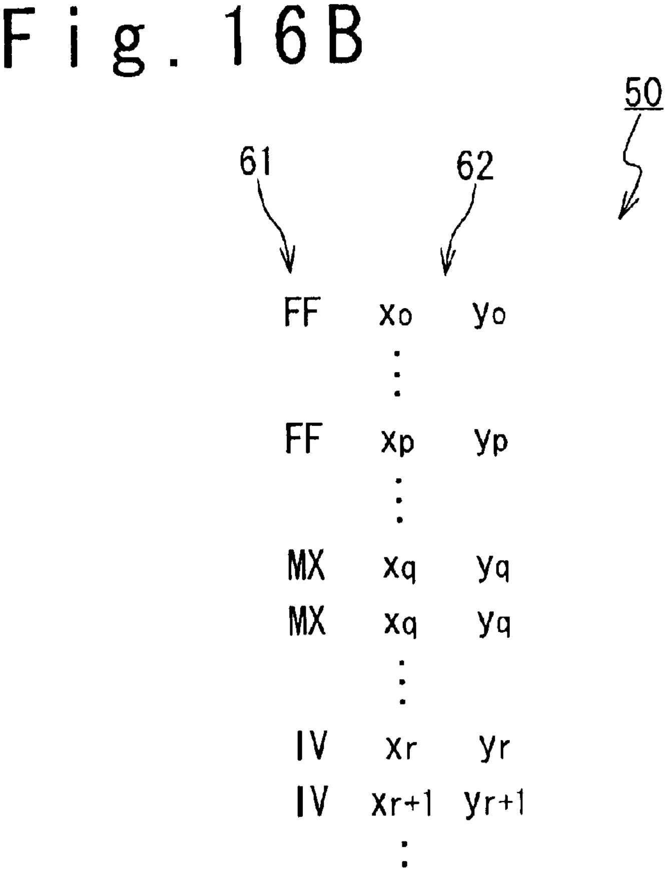
FIG. 16B shows contents of a site array data 50.

As shown in FIG. 16B, the site array data 50 includes a name field 61 describing the site name of each site and a coordinate field 62 describing the coordinate (or the position) of the associated site. For example, the site array data 50 represent that one "FF" site 21 having a site name "FF" is positioned at ($x_0$, $y_0$), and another "FF" site 21 having the same site name "FF" is positioned at ($x_p$, $y_p$).

The site name has a function to indicate a cell name of cells which are allowed to be placed in the associated site. For example, an "FF" site 21 having a site name "FF" allows cells having a cell name "FF" to be placed therein. It should be noted that the site name is not unique to each site: each site is identified by the combination of the coordinate and the site name thereof.

With reference to FIG. 15, the netlist 51 describes cells and their connections. The netlist 51 includes information on the cell type of each cell. The cells described in the netlist 51 are grouped into a plurality of groups (or blocks), and information on the groups is appended to the netlist 51.

The area data 52 represents the arrangement of the areas Area1 to Area16. In one embodiment, the area data 52 includes the coordinates of the corners of each of the areas Area1 to Area16.

Figures 17, 18:
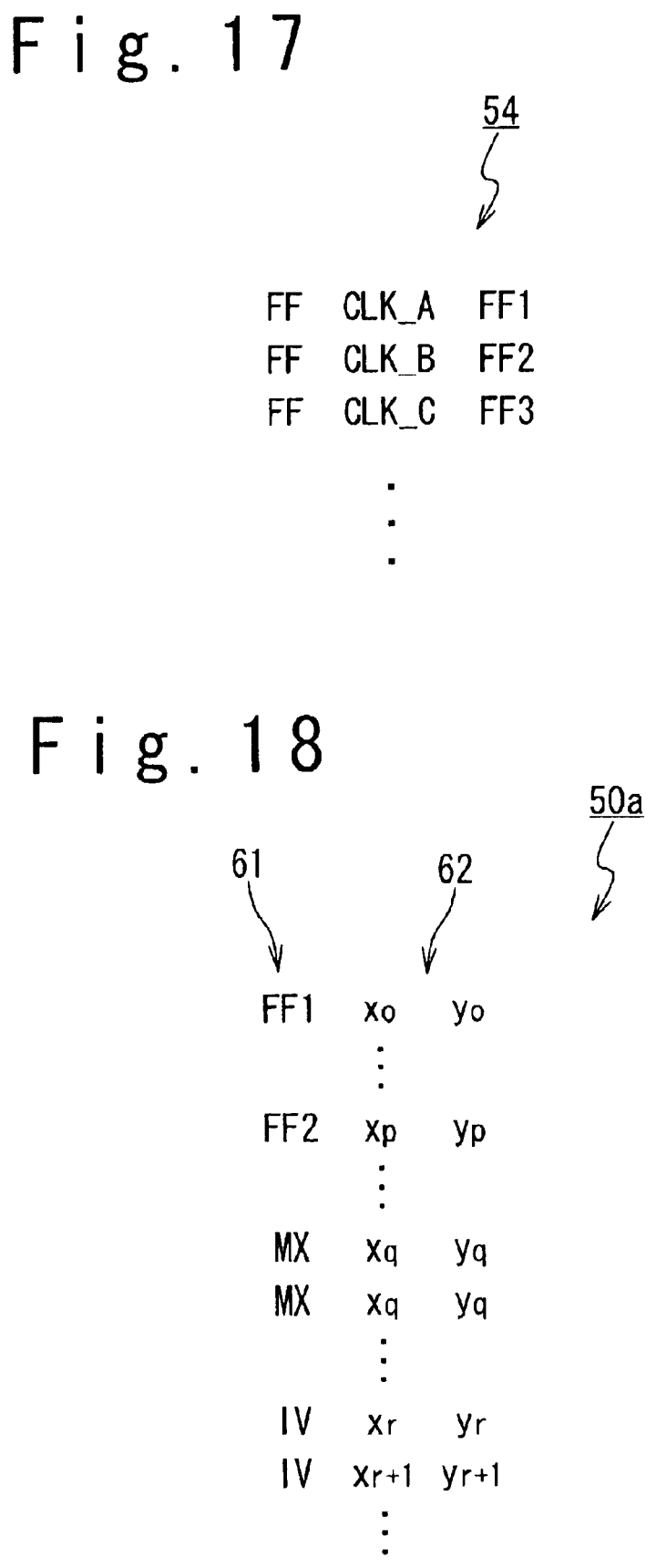

The modification table 54 is used for modification of site names described in the site array data 50, which will be described in detail later. As shown in FIG. 17, the modification table 54 describes the association of the combination of the site name and the multi-phase clock signal to the site name after the modification. For example, the modification table 54 describes that the site name "FF" of the sequential circuit sites located in the area(s) to which the multi-phase clock signal CLK_A is distributed is to be modified to be "FF1".

The modification table 54 is also used for modification of cell types described in the netlist 51. As described, the site name indicates a cell name of cells which are allowed to be placed in the associated site. Thus, the description of the modification table 54 also represents the combination of the cell type and the multi-phase clock signal to the cell type after the modification. For example, the modification table 54 describes that the cell type "FF" of the sequential circuit cell within sites located in the area(s) to which the multi-phase clock signal CLK_A is distributed is to be modified to be "FF1".

With reference to FIG. 14, after providing the site array data 50, the netlist 51, the area data 52, and the modification table 54, floor planning is executed at Step 10 with the floor planning tool 13*a* to arrange the groups of the cells.

Clock planning is then executed with the clock planning tool 13*b* at Step S11.

As shown in FIG. 15, the clock planning begins with allocating the multi-phase clock signals CLK_A to CLK_H to the areas Area1 to Area16 at Step 20. The allocation of the multi-phase clock signals CLK_A to CLK_H defines which multi-phase clock signal is distributed to each area.

The allocation of the multi-phase clock signals CLK_A to CLK_H may be manually achieved. In one embodiment, the clock planning tool 13*b* provides a graphical user interface (GUI) to allow the user to select one of the multi-phase clock signals CLK_A to CLK_H.

Selecting one multi-phase clock signal allows the clock planning tool 13*b* to determine one or more group areas. The group area implies the area where the circuit group(s) associated with the selected multi-phase clock signal is placed.

The clock planning tool 13*b* prompts the user to select one or more of the area(s) which belongs to the group area(s). Selecting one or more area(s) allows the clock planning tool 13*b* to allocate the selected multi-phase clock signal to the selected area(s). After the allocation, the clock planning tool 13*b* produces an allocation data 53 representative of the association of the multi-phase clock signals CLK_A through CLK_H to the areas Area1 through Area16. The allocation data 53 is stored in an allocation data file.

In an alternative embodiment, the allocation data 53 may be predefined and previously stored in the allocation data file in the storage device 13. The clock planning tool 13*b* achieves the allocation of multi-phase clock signals CLK_A to CLK_H through obtaining the allocation data 53 from the allocation data file.

After the allocation of the multi-phase clock signals CLK_A through CLK_H to the areas Area1 through Area16, the clock planning tool 13*b* modifies the site array data 50 on the basis of the allocation data 53 at Step S21 so that the site array data 50 allows each area to include sequential circuit cells provided with the same multi-phase clock signal. The detailed sequence of the modification of the site array data 50 is described below.

Firstly, the clock planning tool 13*b* selects one of the multi-phase clock signals CLK_A to CLK_H.

The clock planning tool 13*b* then selects the area(s) associated with the selected clock signal from among the areas Area1 to Area16 on the basis of the allocation data 53. For example, the clock planning tool 13*b* selects the area Area1 when the area Area1 is associated with the multi-phase clock CLK_A, that is, the multi-phase clock CLK_A is allocated to the area Area1 at the step 20.

After selecting the area(s), the clock planning tool 13*b* extracts sites located in the selected area(s) from among the sequential circuit sites 2 on the basis of the site array data 50 and the area data 52. The area data 52 describes the coordinates of the corners of each site, and the site array data 50 describes the coordinates of the sites. Therefore, referring the site array data 50 and the area data 52 allows the clock planning tool 13*b* to determine the sites to be extracted.

The clock planning tool 13*b* then modifies the site names of the extracted sites. The site name after the modification is defined so as to be specific to the selected clock signal. The site name is modified referring to a site name association table 54 shown in FIG. 15.

The same goes for other multi-phase clock signals. This results in that the site names of the sequential circuit sites 2 are determined so that the site name of each sequential circuit site 2 is determined depending on which clock signal is distributed to the area where the sequential circuit site 2 is located: a site name of a site located in an area to which one of the multi-phase clock signals CLK_A to CLK_H is different from a site name of another site located in another area to which another of the multi-phase clock signals.

For example, the site names "FF" of the sequential sites located in the area associated to the multi-phase clock signal CLK_A is modified to be "FF1", and the site names "FF" of the sequential sites located in the area associated to the multi-phase clock signal CLK_B is modified to be "FF2", as shown in FIG. 18.

The modified site array data 50*a* is stored in the site array data file.

After the modification of the site array data 50, the cell types described in the netlist 50 are modified at Step 22 so as to allow the netlist 50 to correspond to the modified site array data 50*a*. The modification of the netlist 51 is achieved referring to the modification table 54. Combinations of cell types and multi-phase clock signals are extracted from the netlist 51, and the cell types described in the netlist 51 are replaced with the cell types associated with the combinations. The modified netlist 51*a* is stored in the netlist file. Storing the modified netlist 51*a* completes the clock planning at Step 11.

After the clock planning, as shown in FIG. 14, the place-and-route tool 13*c* places the cells within the integrated circuit 1 on the basis of the modified site array data 50 at Step 12. Clock-tree-forming portions where the multiplexers MC101 to MC108, MC201 to MC216, and MC301 to MC316 are to be placed to form the clock tree structure are previously reserved in the core region, and the other cells described in the modified netlist 50*a* are placed in the remaining portions. This ensures the reduced skews of the multi-phase clock signals CLK_A to CLK_H distributed by the clock tree structure.

The site where each cell is placed is determined depending on the cell type of each cell on the basis of the modified site array data 50*a*. The modified site array data 50*a* describes the cell type of cells that each site allows to be placed therein. This allows sequential circuit cells to which the same clock signal is distributed to be placed in the area(s) associated with the clock signal.

The placement of the cells is followed by clock net replacement at Step 13. At Step 13, portions of the core region which correspond to the clock net and nets connected to the clock net, whose positions are described in a library, are replaced with a layout of multiplexers MC101 to MC108, MC201 to MC216, and MC301 to MC316 stored in the library.

The clock net replacement at Step 13 preferably includes placement of dummy load elements to be connected to the output of the multiplexers MC301 to MC316 so as to uniform the loads of the multiplexers MC301 to MC316. The dummy load elements may includes the aforementioned unused sequential circuit cells. Connecting the dummy load elements effectively reduces skews of the multi-phase clock signals CLK_A to CLK_H.

The place-and-route tool 13*c* then executes routing on the basis of the netlist 50*a* at Step 14. The routing achieves a layout of the desired integrated circuit 1.

The aforementioned design method enables an automatic allocation of the multi-phase clock signals to each of the sequential circuit cells within the desired integrated circuit, and thus facilitate the design of the clock tree structure.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

Especially, it should be noted that the layout of the integrated circuit to be designed, such as the number of multi-phase clock signal, and the arrangement of the areas, the multiplexers, and the sites, is not limited to that disclosed in the embodiment.

What is claimed is:

1. A gate array design method for an integrated circuit utilizing multi-phase clock signals, said integrated circuit having a core region which is divided into a plurality of areas, each of said plurality of areas including sequential circuit sites and combination circuit sites, said method comprising:

providing a netlist describing cells and interconnections thereof within said integrated circuit, said cells including sequential circuit cells to be placed in said sequential circuit sites and combination circuit cells to be placed in said combination circuit sites, different ones of said sequential circuit cells operating with different ones of said multi-phase clock signals;

providing a site array data which describes site names of said sites and arrangement of said sequential circuit cells and combination circuit cells within said sites, said sites name respectively indicating cell types of cells which are allowed to be placed within said sites associated therewith, said cell types including said sequential circuit cells and said combination circuit cells;

allocating each of multi-phase clock signals used in said integrated circuit to each of said plurality of areas to produce an allocation data representative of an association of said multi-phase clock signals to specific ones of said plurality of areas;

modifying said site array data based on said allocation data such that each of said plurality of areas only includes sequential circuit cells which operate with the same ones of said multi-phase clock signals;

modifying said netlist to allow said netlist to correspond to said modified site array data; and placing said integrated circuit based on said modified netlist and said modified site array data.

2. The gate array design method according to claim 1, wherein said plurality of areas include:

a first area associated with one of said multi-phase clock signals, and a second area associated with another of said multi-phase clock signals, wherein said sequential circuit sites include:

first sequential circuit sites having sequential circuit cells operating with said one multi-phase clock signal, located in said first area, and second sequential circuit sites having sequential circuit cells operating with said another multi-phase clock signal, located in said second area, and wherein said site names described in said site array data are modified such that site names of said first sequential circuit sites are different from site names of said second sequential circuit sites.

3. The gate array design method according to claim 2, wherein said netlist is modified such that cell types of sequential circuit cells located within said first sequential circuit sites correspond to said site names of said first sequential circuit sites, and that cell types of sequential circuit cells located within said second sequential circuit sites correspond to said site names of said second sequential circuit sites to be different from said cell types of sequential circuit cells located within said first sequential circuit sites.

4. The gate array design method according to claim 1, wherein said allocating includes:

providing a graphical user interface which allows a user to allocate each of multi-phase clock signals used in said integrated circuit to each of said plurality of areas.

5. The gate array design method according to claim 1, wherein said allocating includes:

obtaining said allocation data from a previously provided allocation data file.

6. A computer-readable medium on which is stored a computer program for designing an integrated circuit utilizing multi-phase clock signals, said integrated circuit having a core region which is divided into a plurality of areas, each of said plurality of areas including sequential circuit sites and combination circuit sites, said computer program comprising instructions which, when executed by a computer, perform the steps of:

providing a netlist describing cells and interconnections thereof within said integrated circuit, said cells including sequential circuit cells to be placed in said sequential circuit sites and combination circuit cells to be placed in said combination circuit sites, different ones of said sequential circuit cells operating with different ones of said multi-phase clock signals;

providing a site array data which describes site names of said sites and arrangement of said sequential circuit cells and combination circuit cells within said sites, said sites name respectively indicating cell types of cells which are allowed to be placed within said sites associated therewith, said cell types including said sequential circuit cells and said combination circuit cells;

allocating each of multi-phase clock signals used in said integrated circuit to each of said plurality of areas to produce an allocation data representative of an association of said multi-phase clock signals to specific ones of said plurality of areas;

first modifying said site array data based on said allocation data such that each of said plurality of areas only includes sequential circuit cells which operate with the same ones of said multi-phase clock signals;

second modifying said netlist based on said modified site array data; and placing and routing said integrated circuit based on said modified netlist.

7. The computer-readable medium according to claim 6, wherein said plurality of areas include:

a first area associated with one of said multi-phase clock signals, and a second area associated with another of said multi-phase clock signals, wherein said sequential circuit sites include:

first sequential circuit sites having sequential circuit cells operating with said one multi-phase clock signal located in said first area, and second sequential circuit sites having sequential circuit cells operating with said another multi-phase clock signal, located in said second area, and wherein said site names described in said site array data are modified such that site names of said first sequential circuit sites are different from site names of said second sequential circuit sites.

8. The computer-readable medium according to claim 7, wherein said netlist is modified such that cell types of sequential circuit cells located within said first sequential circuit sites correspond to said site names of said first sequential circuit sites, and that cell types of sequential circuit cells located within said second sequential circuit sites correspond to said site names of said second sequential circuit sites to be different from said cell types of sequential circuit cells located within said first sequential circuit sites.

9. The computer-readable medium according to claim 6, wherein said allocating includes:

providing a graphical user interface which allows a user to allocate each of multi-phase clock signals used in said integrated circuit to each of said plurality of areas.

10. The computer-readable medium according to claim 6, wherein said allocating includes:

obtaining said allocation data from a previously provided allocation data file.

* * * * *